United States Patent
Liu

(10) Patent No.: US 11,967,520 B2
(45) Date of Patent: Apr. 23, 2024

(54) METHOD FOR MAKING HIGH-VOLTAGE THICK GATE OXIDE

(71) Applicant: Hua Hong Semiconductor (Wuxi) Limited, Wuxi (CN)

(72) Inventor: Junwen Liu, Wuxi (CN)

(73) Assignee: Hua Hong Semiconductor (Wuxi) Limited, Wuxi (CN)

( * ) Notice: Subject to any disclaimer, the term of this patent is extended or adjusted under 35 U.S.C. 154(b) by 197 days.

(21) Appl. No.: 17/531,245

(22) Filed: Nov. 19, 2021

(65) Prior Publication Data

US 2022/0189820 A1    Jun. 16, 2022

(30) Foreign Application Priority Data

Dec. 14, 2020  (CN) .......................... 202011462782.2

(51) Int. Cl.
*H01L 21/762*    (2006.01)
*H01L 21/02*    (2006.01)
*H01L 21/311*    (2006.01)

(52) U.S. Cl.
CPC .. *H01L 21/76224* (2013.01); *H01L 21/02164* (2013.01); *H01L 21/0217* (2013.01); *H01L 21/02359* (2013.01); *H01L 21/31144* (2013.01)

(58) Field of Classification Search
CPC ......... H01L 21/76224; H01L 21/02164; H01L 21/0217; H01L 21/02359; H01L 21/31144
See application file for complete search history.

(56) References Cited

U.S. PATENT DOCUMENTS 6,468,853 B1 * 10/2002 Balasubramanian ....................... H01L 21/76235
438/424

FOREIGN PATENT DOCUMENTS

| CN | 101211846 | * | 12/2007 | ......... H01L 21/8234 |
| CN | 101373703 | * | 2/2009 | ............. H01L 21/00 |
| CN | 103137453 | * | 6/2013 | |

* cited by examiner

*Primary Examiner* — Monica D Harrison
*Assistant Examiner* — Andre C Stevenson
(74) *Attorney, Agent, or Firm* — Murtha Cullina, LLP

(57) ABSTRACT

A method for making a high-voltage thick gate oxide, which includes depositing a pad silicon oxide on a silicon substrate and depositing a pad silicon nitride on the pad silicon oxide; performing shallow trench isolation photolithography, etching, silicon oxide filling and chemical mechanical polishing; sequentially depositing a mask silicon nitride and a mask silicon oxide on a silicon wafer; removing the mask silicon oxide and the mask silicon nitride in a high-voltage thick gate oxide region, and remaining the pad silicon nitride between two shallow trench isolations in the high-voltage thick gate oxide region; performing first thermal oxidation growth; removing the pad silicon nitride between the two shallow trench isolations in the high-voltage thick gate oxide region; performing second thermal oxidation growth to produce a high-voltage thick gate oxide.

9 Claims, 6 Drawing Sheets

METHOD FOR MAKING HIGH-VOLTAGE THICK GATE OXIDE

CROSS-REFERENCES TO RELATED APPLICATIONS

This application claims the priority to Chinese patent application No. CN202011462782.2, filed on Dec. 14, 2020 and entitled "METHOD FOR MAKING HIGH-VOLTAGE THICK GATE OXIDE", the disclosure of which is incorporated herein by reference in its entirety.

TECHNICAL FIELD

The present application relates to a semiconductor manufacturing technology. In particular, the present application relates to a method for making a high-voltage thick gate oxide.

BACKGROUND

With the miniaturization of process dimension, the isolation process of semiconductor devices has changed from LOCAL Oxidation of Silicon (LOCOS) to Shallow Trench Isolation (STI). An STI structure is formed by forming a trench in a semiconductor substrate and filling the trench with a dielectric material. Due to the inherent structural feature of STI, when making a high-voltage device and growing a thick gate oxide, thin gate oxides and sharp corners always appear at the STI corners, which directly affect the reliability of the thick gate oxide and the performance of the related device.

At present, there are some STI thick gate oxide production solutions to solve the problem at STI corners. One is to adopt a double STI process, referring to FIG. 1 and FIG. 2, which needs a photomask for a high-voltage STI process alone, resulting in high cost. The other is to adopt an oxide layer deposition process, as illustrated FIG. 3, which can only achieve partial improvement and has poorer reliability than thermal oxide growth.

Referring to FIG. 4 to FIG. 7, a traditional process for making a high-voltage thick gate oxide includes the following steps:

(1) A pad silicon oxide (PAD Oxide) is deposited on a silicon substrate, and a pad silicon nitride (PAD SIN) is deposited on the pad silicon oxide; STI photolithography and etching are performed; STI silicon oxide filling and chemical mechanical polishing (Oxide Filling and CMP) is performed, referring to FIG. 4.

(2) The pad silicon nitride is removed, referring to FIG. 5.

(3) Photolithography and etching are performed to produce a mask silicon nitride on the pad silicon oxide outside a high-voltage thick gate oxide region, referring to FIG. 6.

(4) Silicon oxide growth is performed on the pad silicon oxide and the STI silicon oxide in the high-voltage thick gate oxide region to form a high-voltage thick gate oxide, referring to FIG. 7.

BRIEF SUMMARY

A technical problem to be solved by the present application is to provide a method for making a high-voltage thick gate oxide, the gate oxide at the Shallow Trench Isolation (STI) corners in the thick gate oxide of an obtained high-voltage device is thickened, passivated and smoothed, the problem of sharp STI corners is eliminated, the reliability of the high-voltage thick gate oxide and the performance of the high-voltage device are improved, the process is simple and the cost is low.

In order to solve the technical problem, the method for making the high-voltage thick gate oxide provided by the present application comprises the following steps: step 1: depositing a pad silicon oxide 11 on a silicon substrate 1 and depositing a pad silicon nitride 21 on the pad silicon oxide 11; performing STI photolithography and etching; performing STI silicon oxide filling and chemical mechanical polishing; step 2: depositing a mask silicon nitride 22 on a silicon wafer and depositing a mask silicon oxide 12 on the mask silicon nitride 22; step 3: performing photolithography and etching by using the mask silicon oxide 12 as a hard mask, removing the mask silicon oxide 12 and the mask silicon nitride 22 in a high-voltage thick gate oxide region, and remaining the pad silicon nitride 21 between two STIs in the high-voltage thick gate oxide region; step 4: performing first thermal oxidation growth to passivate STI corners in the high-voltage gate oxide region; step 5: removing the pad silicon nitride 21 between the two STIs in the high-voltage thick gate oxide region; step 6: performing second thermal oxidation growth to produce a high-voltage thick gate oxide; and step 7: removing all of the mask silicon nitride 22 and pad silicon nitride 21.

As a further improvement, after step 5, the pad silicon oxide 11 on the silicon substrate 1 between the two STIs and the mask silicon oxide 12 on the mask silicon nitride 22 outside the high-voltage thick gate oxide region are removed, cleaning is performed and then step 6 is performed; in step 6, the second thermal oxidation growth is performed on the silicon substrate 1 in the high-voltage thick gate oxide region to produce the high-voltage thick gate oxide.

As a further improvement, wet oxygen oxidation, water vapor oxidation or dry oxygen oxidation is adopted in the first thermal oxidation growth; wet oxygen oxidation, water vapor oxidation or dry oxygen oxidation is adopted in the second thermal oxidation growth.

As a further improvement, dry oxygen oxidation is adopted in the first thermal oxidation growth; wet oxygen oxidation or water vapor oxidation is adopted in the second thermal oxidation growth.

As a further improvement, a wet oxygen oxidation process is adopted in the first thermal oxidation growth; the operation temperature of the wet oxygen oxidation process is 800-900° C., the oxygen flow rate is 24-26 L/min, and the hydrogen flow rate is 26-28 L/min.

As a further improvement, in step 5, the pad silicon nitride 21 between the two STIs in the high-voltage thick gate oxide region is removed by adopting a wet process.

As a further improvement, the pad silicon nitride 21 between the two STIs in the high-voltage thick gate oxide region is removed by etching with mixed solution of hydrofluoric acid and ethylene glycol.

As a further improvement, the pad silicon nitride 21 between the two STIs in the high-voltage thick gate oxide region is removed by etching with hot phosphoric acid solution.

As a further improvement, the pad silicon nitride 21 and the mask silicon nitride 22 are formed by adopting a furnace tube low-pressure chemical vapor deposition process.

In the method for making the high-voltage thick gate oxide provided by the present application, photolithography and etching are performed by using the mask silicon oxide 12 as a hard mask, the mask silicon nitride 22 in the high-voltage thick gate oxide region is removed, the pad silicon nitride 21 between the two STIs in the high-voltage thick gate oxide region is remained, so that the STI corners in the high-voltage gate oxide region can be passivated through thermal oxidation growth, the morphology is optimized, the gate oxide at the STI corners of the obtained high-voltage device is thickened, passivated and smoothed, the problem of sharp STI corners is eliminated, the reliability of the high-voltage thick gate oxide and the performance of the high-voltage device are improved, the process is simple and the cost is low.

BRIEF DESCRIPTION OF THE DRAWINGS

In order to describe the technical solution of the present application more clearly, the following is a brief introduction to the drawings required by the present application. The drawings in the following description are only some embodiments of the present application. For those skilled in the art, other drawings may be obtained from these drawings without contributing any inventive labor.

DESCRIPTION OF REFERENCE SIGNS

1—silicon substrate; 11—pad silicon oxide; 12—mask silicon oxide; 21—pad silicon nitride; 22—mask silicon nitride.

DETAILED DESCRIPTION OF THE APPLICATION

The technical solution of the present application will be described below clearly and completely with reference to the drawings. Obviously, the described embodiments are part of the embodiments of the present application, not all of them. Based on the embodiments in the present application, all other embodiments obtained by those skilled in the art without contributing any inventive labor shall fall within the scope of protection of the present application.

Embodiment 1

Figure 1:
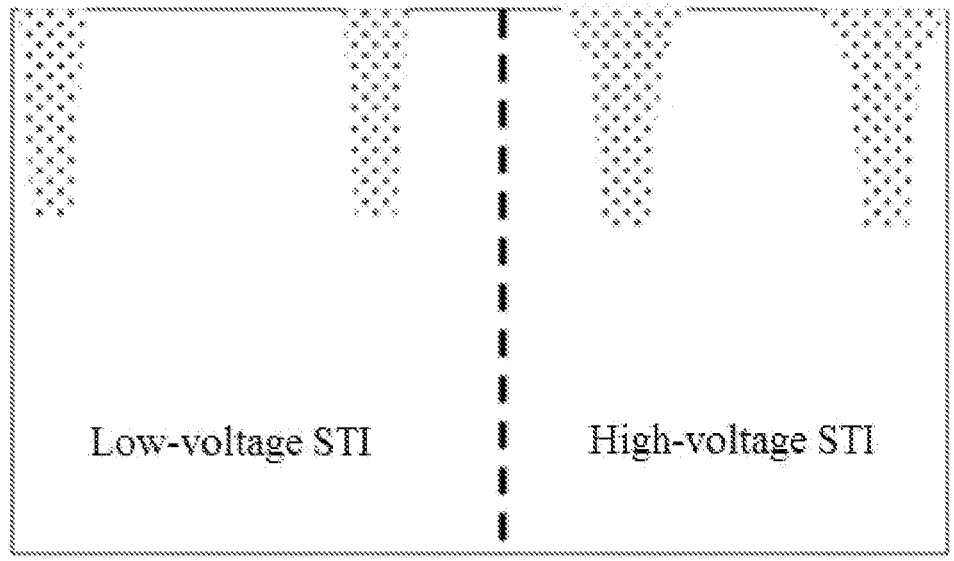
FIG. 1 and FIG. 2 illustrate schematic diagrams of an STI thick gate oxide produced by adopting a double STI process according to the prior art.
Figure 2:
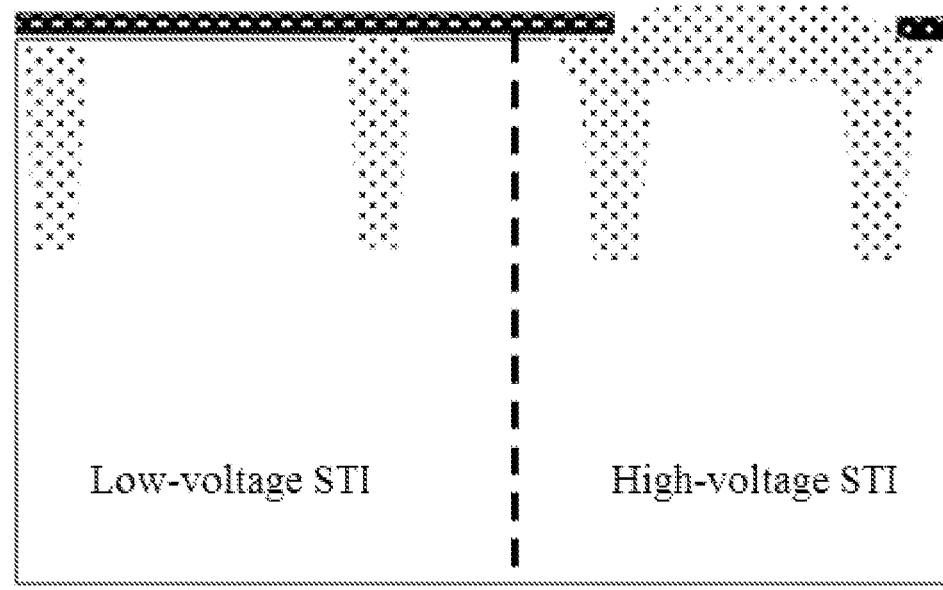
Figure 3:
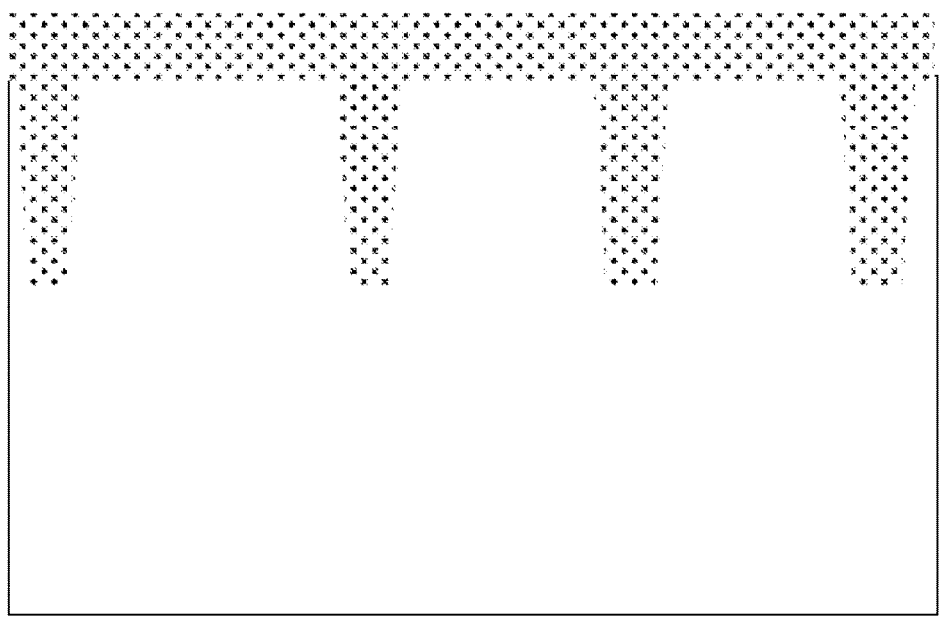
FIG. 3 illustrates a schematic diagram of an STI thick gate oxide produced by adopting an oxide layer deposition process according to the prior art.
Figure 4:
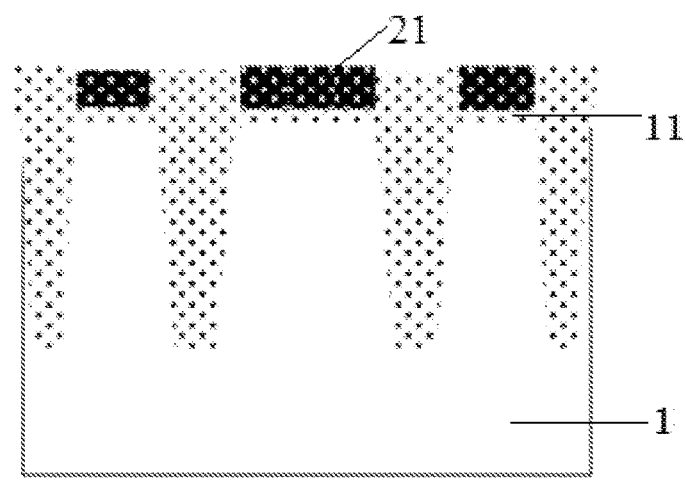
FIG. 4 to FIG. 7 illustrate schematic diagrams of a traditional process for making a high-voltage thick gate oxide.
Figure 5:
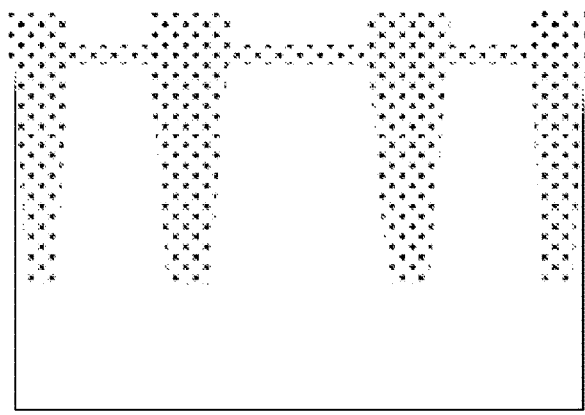
Figure 6:
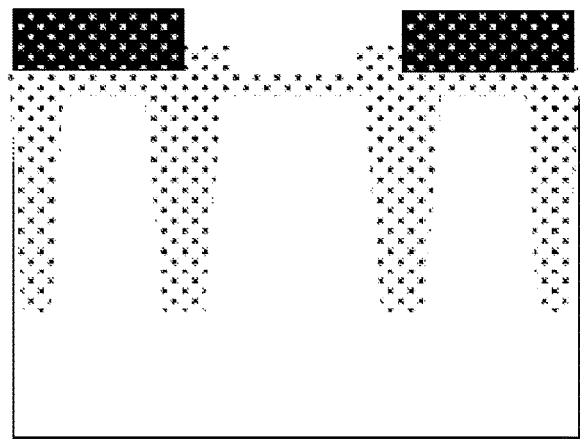
Figure 7:
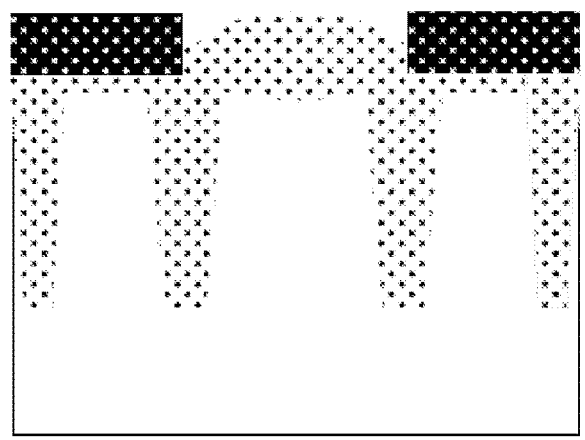
Figure 8:
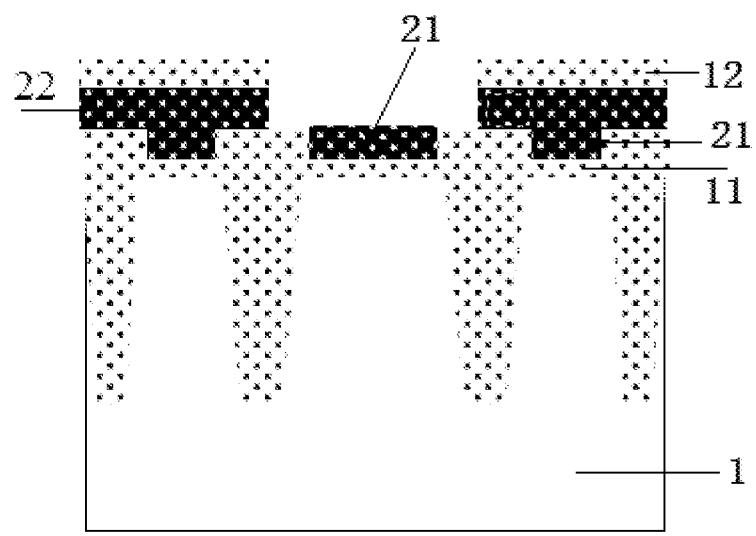
FIG. 8 to FIG. 13 illustrate schematic diagrams of an exemplary process of a method for making a high-voltage thick gate oxide according to the present application.
Figure 9:
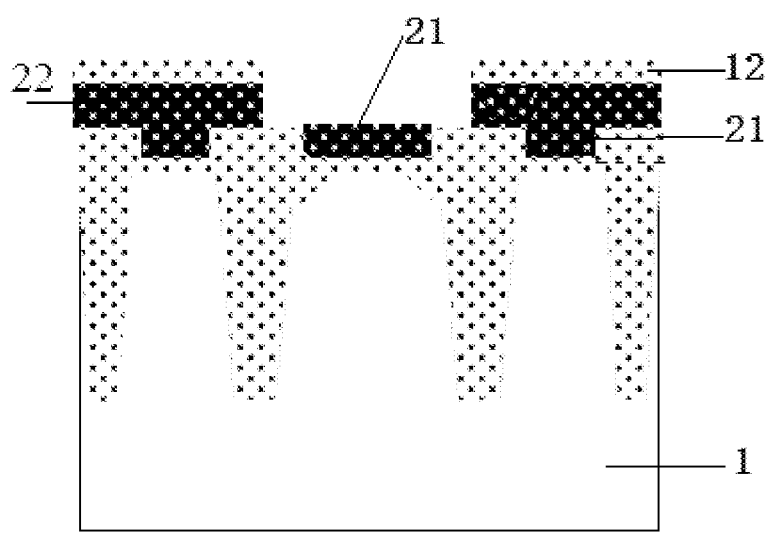
Figure 10:
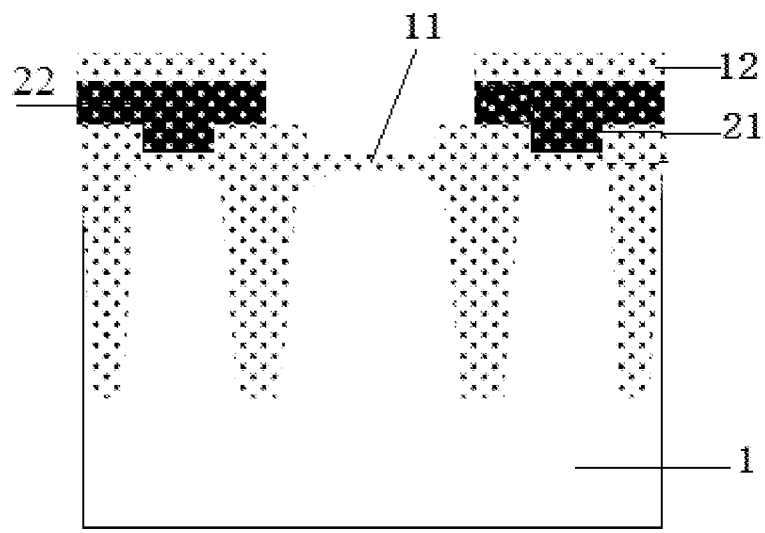
Figure 12:
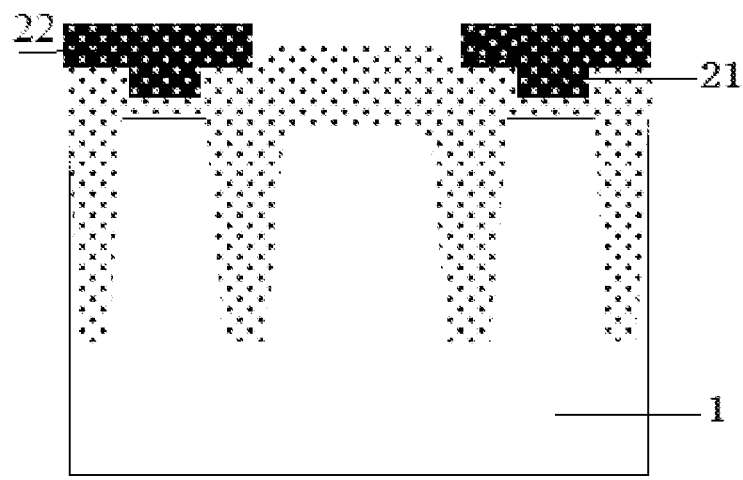
Figure 13:
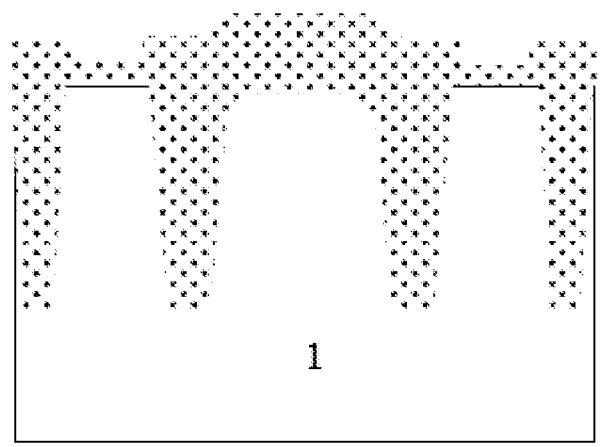

A method for making a high-voltage thick gate oxide includes the following steps: in step 1, a pad silicon oxide (PAD Oxide) 11 is deposited on a silicon substrate 1 and a pad silicon nitride (PAD SIN) 21 is deposited on the PAD Oxide 11; shallow trench isolation (STI) photolithography and etching are performed; STI silicon oxide filling and chemical mechanical polishing (Oxide Filling and CMP) are performed, referring to FIG. 4; in step 2, a mask silicon nitride 22 is deposited on a silicon wafer and a mask silicon oxide 12 is deposited on the mask silicon nitride 22; in step 3, photolithography and etching are performed by using the mask silicon oxide 12 as a hard mask, the mask silicon oxide 12 and the mask silicon nitride 22 in a high-voltage thick gate oxide region are removed, and the PAD SIN 21 between two STIs in the high-voltage thick gate oxide region is remained, referring to FIG. 8; in step 4, first thermal oxidation growth is performed to passivate STI corners in the high-voltage gate oxide region, referring to FIG. 9; in step 5, the PAD SIN 21 between the two STIs in the high-voltage thick gate oxide region is removed, referring to FIG. 10; in step 6, second thermal oxidation growth is performed to produce a high-voltage thick gate oxide, referring to FIG. 12; in step 7, all of the mask silicon nitride 22 and PAD SIN 21 are removed, referring to FIG. 13.

In the method for making the high-voltage thick gate oxide according to embodiment 1, photolithography and etching are performed by using the mask silicon oxide 12 as a hard mask, the mask silicon nitride 22 in the high-voltage thick gate oxide region is removed, the PAD SIN 21 between the two STIs in the high-voltage thick gate oxide region is remained, so that the STI corners in the high-voltage gate oxide region can be passivated through thermal oxidation growth, the morphology is optimized, the gate oxide at the STI corners of the obtained high-voltage device is thickened, passivated and smoothed, the problem of sharp STI corners is eliminated, the reliability of the high-voltage thick gate oxide and the performance of the high-voltage device are improved, the process is simple and the cost is low.

Embodiment 2

Figure 11:
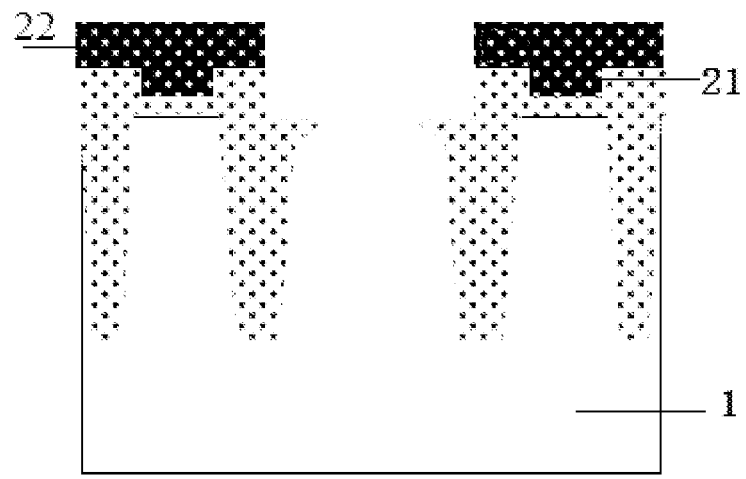

Based on the method for making the high-voltage thick gate oxide according to embodiment 1, after step 5, the PAD Oxide 11 on the silicon substrate 1 between the two shallow trench isolations and the mask silicon oxide 12 on the mask silicon nitride 22 outside the high-voltage thick gate oxide region are removed (referring to FIG. 11), cleaning is performed and then step 6 is performed; in step 6, the second thermal oxidation growth is performed on the silicon substrate 1 in the high-voltage thick gate oxide region to produce the high-voltage thick gate oxide.

In the method for making the high-voltage thick gate oxide according to embodiment 2, the PAD Oxide 11 deposited on the silicon substrate 1 between the two STIs is removed, and then the high-voltage thick gate oxide is produced on the silicon substrate 1 through second thermal oxidation growth, thus reducing the impurities of the high-voltage thick gate oxide and improving the performance of the high-voltage device.

Embodiment 3

Based on the method for making the high-voltage thick gate oxide according to embodiment 1, wet oxygen oxidation, water vapor oxidation or dry oxygen oxidation is adopted in the first thermal oxidation growth; wet oxygen oxidation, water vapor oxidation or dry oxygen oxidation is adopted in the second thermal oxidation growth.

As a further improvement, dry oxygen oxidation is adopted in the first thermal oxidation growth; wet oxygen oxidation or water vapor oxidation is adopted in the second thermal oxidation growth, and the oxidation speed is fast.

As a further improvement, a wet oxygen oxidation process is adopted in the first thermal oxidation growth, the operation temperature of the wet oxygen oxidation process is 800-900° C. (for example, 850° C.), the oxygen flow rate is 24-26 L/min (for example, 25 L/min), and the hydrogen flow rate is 26-28 L/min (for example, 27 L/min). In the wet oxygen oxidation process, oxygen can penetrate the surface silicon oxide layer and react with the silicon inside the substrate, which can thicken, passivate and smooth the gate oxide at the STI corners, eliminate the problem of sharp STI corners, and improve the reliability of the thick gate oxide of the high-voltage device.

Embodiment 4

Based on the method for making the high-voltage thick gate oxide according to embodiment 1, in step 5, the PAD SIN 21 between the two shallow trench isolations in the high-voltage thick gate oxide region is removed by adopting a wet process.

The PAD SIN 21 between the two shallow trench isolations in the high-voltage thick gate oxide region may be removed by etching with mixed solution of hydrofluoric acid and ethylene glycol, or the PAD SIN 21 between the two shallow trench isolations in the high-voltage thick gate oxide region may be removed by etching with hot phosphoric acid solution.

Embodiment 5

Based on the method for making the high-voltage thick gate oxide according to embodiment 1, the PAD SIN 21 and the mask silicon nitride 22 are formed by adopting a furnace tube low-pressure chemical vapor deposition process, and the cost is low.

What are described above are only exemplary embodiments of the present application, which are not used to limit the present application. Any modification, equivalent replacement, improvement and the like made within the spirit and principle of the present application shall be included in the scope of protection of the present application.

What is claimed is:

1. A method for making a high-voltage thick gate oxide, wherein the method comprises the following steps:
   step 1: depositing a pad silicon oxide on a silicon substrate and depositing a pad silicon nitride on the pad silicon oxide; then performing photolithography and etching to form trenches on the silicon substrate; then performing silicon oxide filling in the trenches and chemical mechanical polishing to form shallow trench isolations;
   step 2: depositing a mask silicon nitride on a silicon wafer and depositing a mask silicon oxide on the mask silicon nitride;
   step 3: performing photolithography and etching by using the mask silicon oxide as a hard mask, removing the mask silicon oxide and the mask silicon nitride in a high-voltage thick gate oxide region, and remaining the pad silicon nitride between two shallow trench isolations in the high-voltage thick gate oxide region;
   step 4: performing first thermal oxidation growth to passivate shallow trench isolation corners in the high-voltage gate oxide region;
   step 5: removing the pad silicon nitride between the two shallow trench isolations in the high-voltage thick gate oxide region;
   step 6: performing second thermal oxidation growth to produce a high-voltage thick gate oxide; and
   step 7: removing all of the mask silicon nitride and pad silicon nitride.

2. The method for making a high-voltage thick gate oxide according to claim 1, wherein after step 5, the pad silicon oxide on the silicon substrate between the two shallow trench isolations and the mask silicon oxide on the mask silicon nitride outside the high-voltage thick gate oxide region are removed, cleaning is performed and then step 6 is performed; and in step 6, the second thermal oxidation growth is performed on the silicon substrate in the high-voltage thick gate oxide region to produce the high-voltage thick gate oxide.

3. The method for making a high-voltage thick gate oxide according to claim 1, wherein wet oxygen oxidation, water vapor oxidation or dry oxygen oxidation is adopted in the first thermal oxidation growth; and wet oxygen oxidation, water vapor oxidation or dry oxygen oxidation is adopted in the second thermal oxidation growth.

4. The method for making a high-voltage thick gate oxide according to claim 1, wherein dry oxygen oxidation is adopted in the first thermal oxidation growth; and wet oxygen oxidation or water vapor oxidation is adopted in the second thermal oxidation growth.

5. The method for making a high-voltage thick gate oxide according to claim 1, wherein a wet oxygen oxidation process is adopted in the first thermal oxidation growth; and the operation temperature of the wet oxygen oxidation process is 800-900° C., the oxygen flow rate is 24-26 L/min, and the hydrogen flow rate is 26-28 L/min.

6. The method for making a high-voltage thick gate oxide according to claim 1, wherein in step 5, the pad silicon nitride between the two shallow trench isolations in the high-voltage thick gate oxide region is removed by adopting a wet process.

7. The method for making a high-voltage thick gate oxide according to claim 6, wherein the pad silicon nitride between the two shallow trench isolations in the high-voltage thick gate oxide region is removed by etching with mixed solution of hydrofluoric acid and ethylene glycol.

8. The method for making a high-voltage thick gate oxide according to claim 6, wherein the pad silicon nitride between the two shallow trench isolations in the high-voltage thick gate oxide region is removed by etching with hot phosphoric acid solution.

9. The method for making a high-voltage thick gate oxide according to claim 1, wherein the pad silicon nitride and the mask silicon nitride are formed by adopting a furnace tube low-pressure chemical vapor deposition process.

\* \* \* \* \*